United States Patent [19]

Berger

[11] 4,264,964
[45] Apr. 28, 1981

[54] DYNAMIC MEMORY CELL OF THE CHARGE TRANSFER TYPE APPLICABLE IN PARTICULAR TO A SHIFT REGISTER

[75] Inventor: Jean-Luc Berger, Paris, France
[73] Assignee: Thomson-CSF, Paris, France
[21] Appl. No.: 75,845
[22] Filed: Sep. 14, 1979

[30] Foreign Application Priority Data

Sep. 15, 1978 [FR] France .................. 78 26552

[51] Int. Cl.³ ............................... G11C 11/34
[52] U.S. Cl. ....................... 365/183; 307/221 C
[58] Field of Search ............. 365/183; 307/221 C, 307/220 C

[56] References Cited

U.S. PATENT DOCUMENTS

| | | | |
|---|---|---|---|
| 3,908,182 | 9/1975 | Lampe et al. | 365/183 |
| 3,986,176 | 10/1976 | Weimer | 365/183 |

OTHER PUBLICATIONS

Sequin et al., "A Symmetrically Balanced Linear Differential Charge-Splitting Input for Charge-Coupled Devices", IEEE Trans. on Electron Devices, vol. ED-24, No. 6, 6/77, pp. 746-750, S746 00 68N.

*Primary Examiner*—Stuart N. Hecker
*Attorney, Agent, or Firm*—Roland Plottel

[57] ABSTRACT

Packets of charges representing an electrical signal are injected into a semiconductor substrate by injection means comprising a diode and two electrodes. The charge packets are transferred to an output diode with a well-defined time-delay by means of electrodes which are disposed on the substrate and to which periodic transfer potentials are applied. The output diode also receives samples of the signal to be stored and is connected to an inverter which serves to regenerate and transmit the signal to the injection means.

12 Claims, 12 Drawing Figures

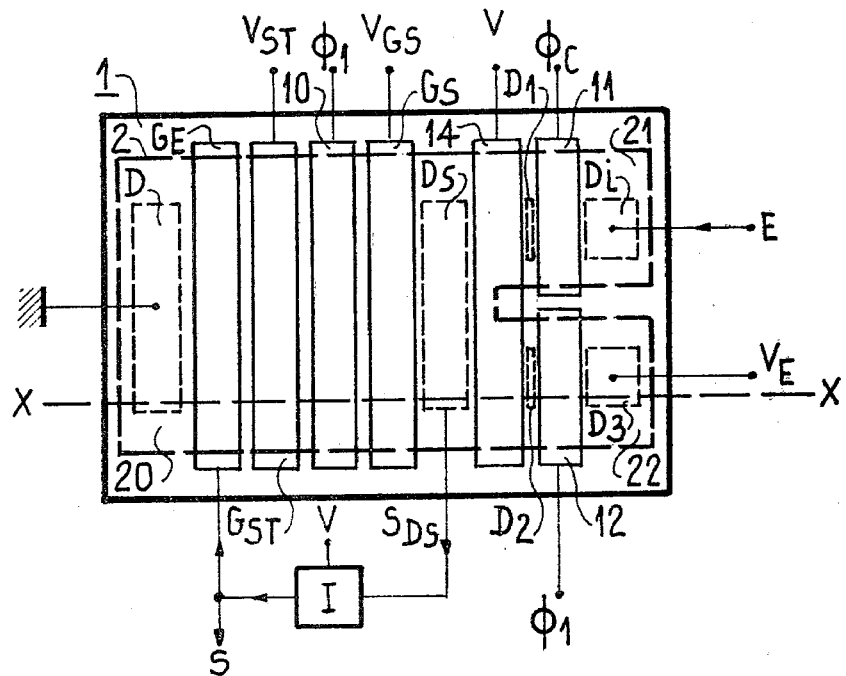
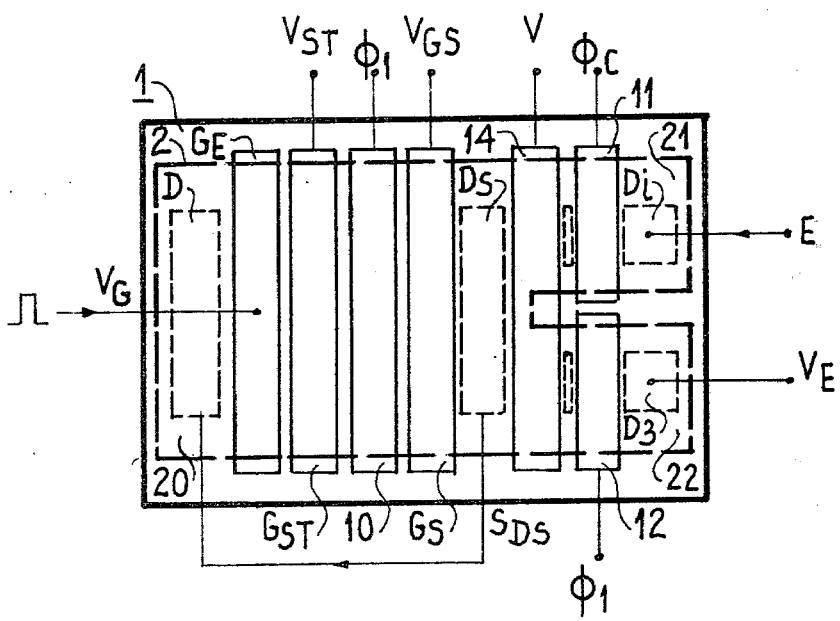

FIG_2
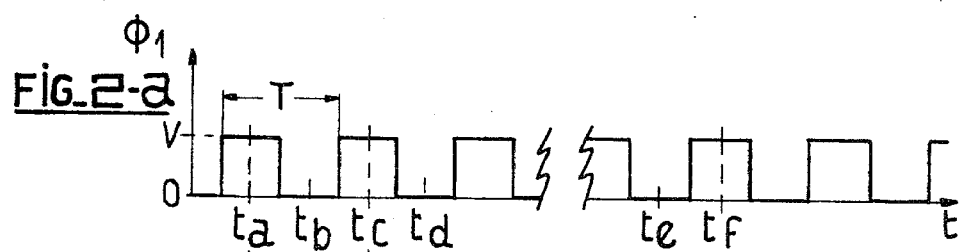
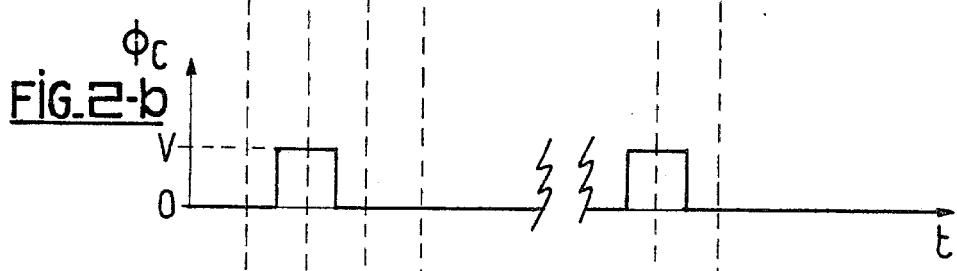
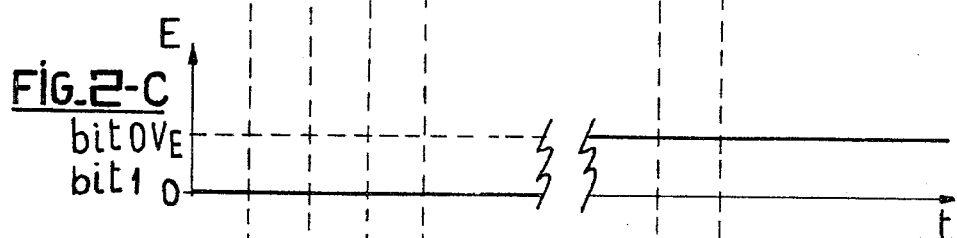
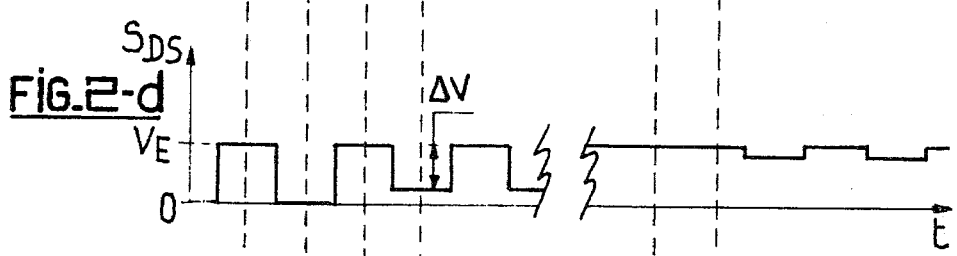
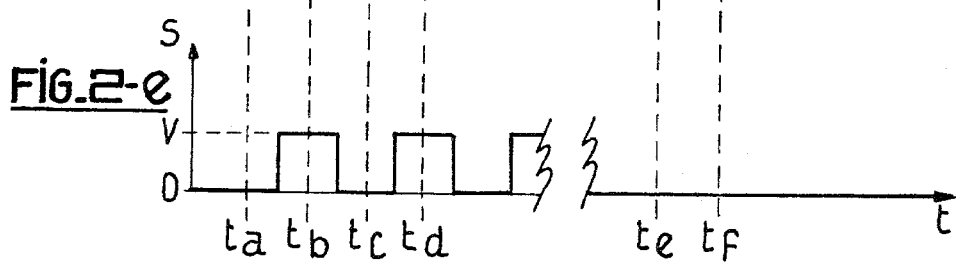

FIG_3
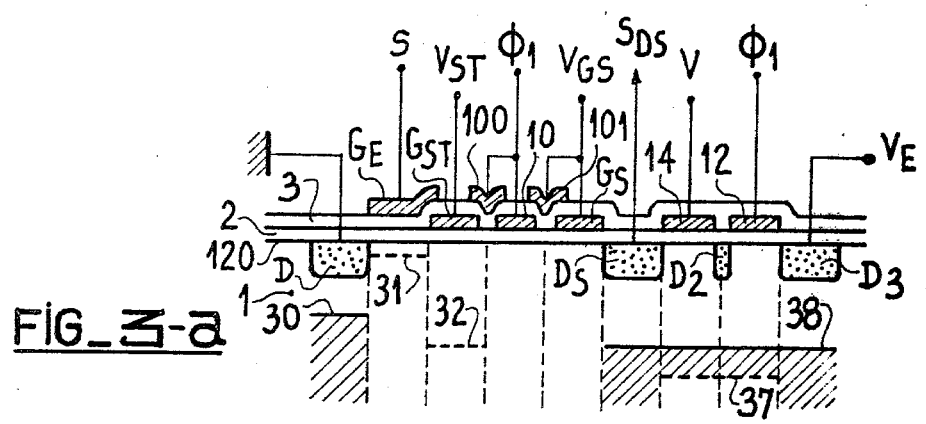
FIG_3-a
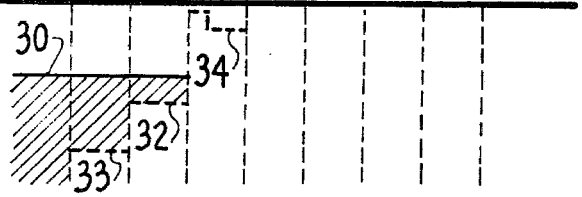
FIG_3-b
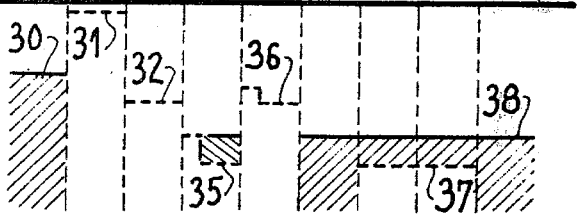
FIG_3-c
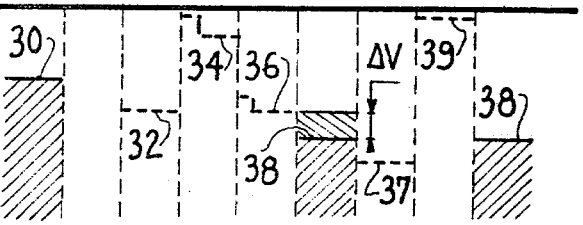
FIG_3-d

FIG_4-a
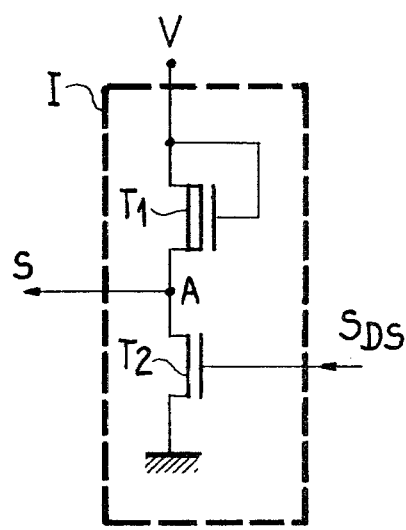
FIG_4-b
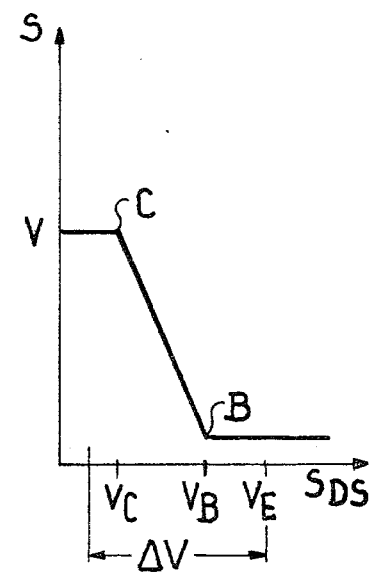
FIG_6
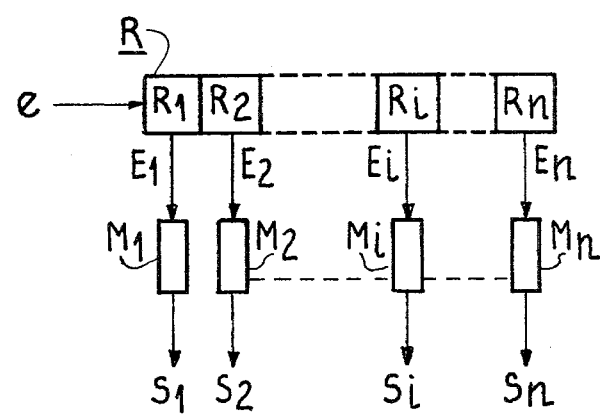

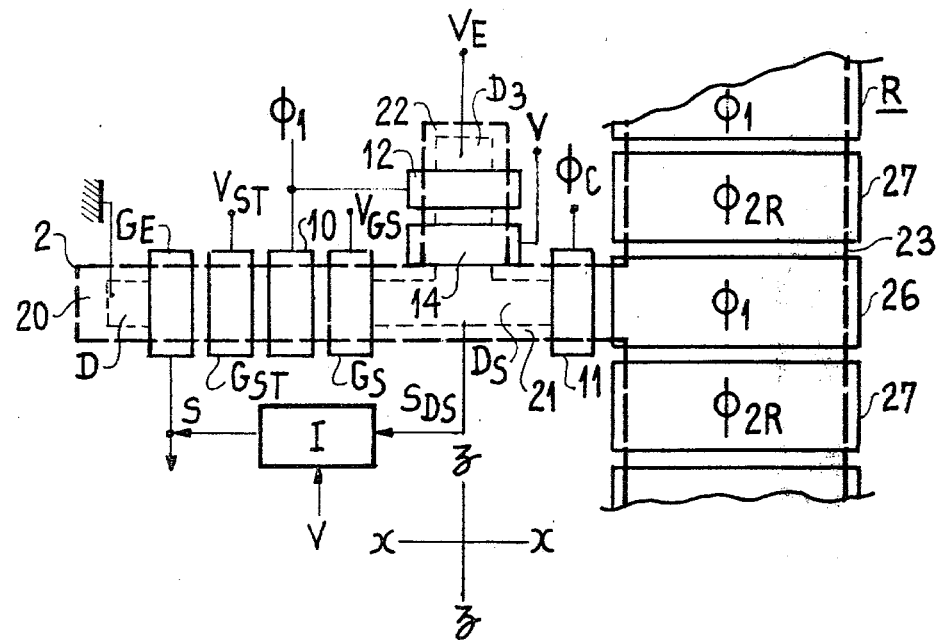
FIG_7
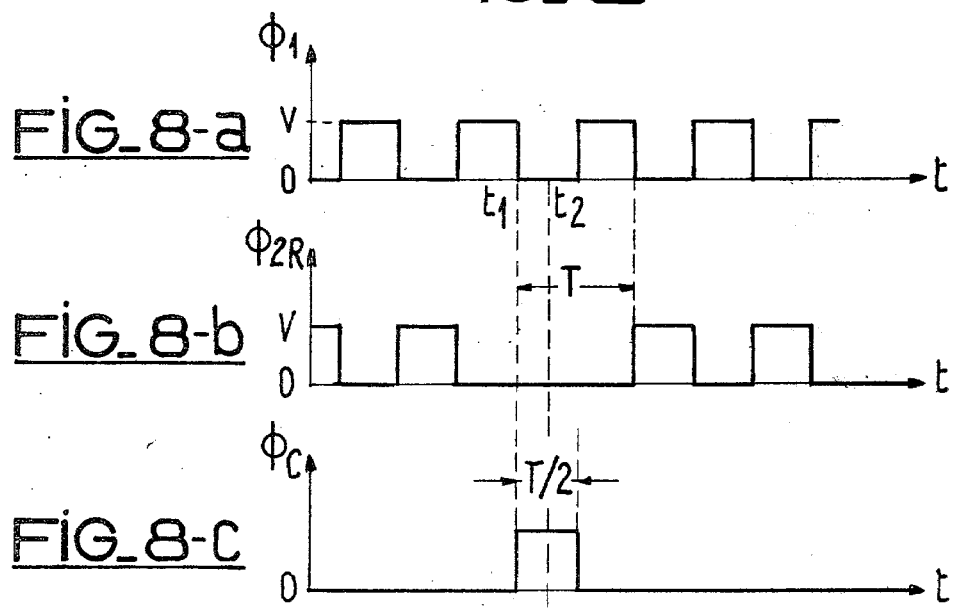
FIG_8
FIG_8-a
FIG_8-b
FIG_8-c

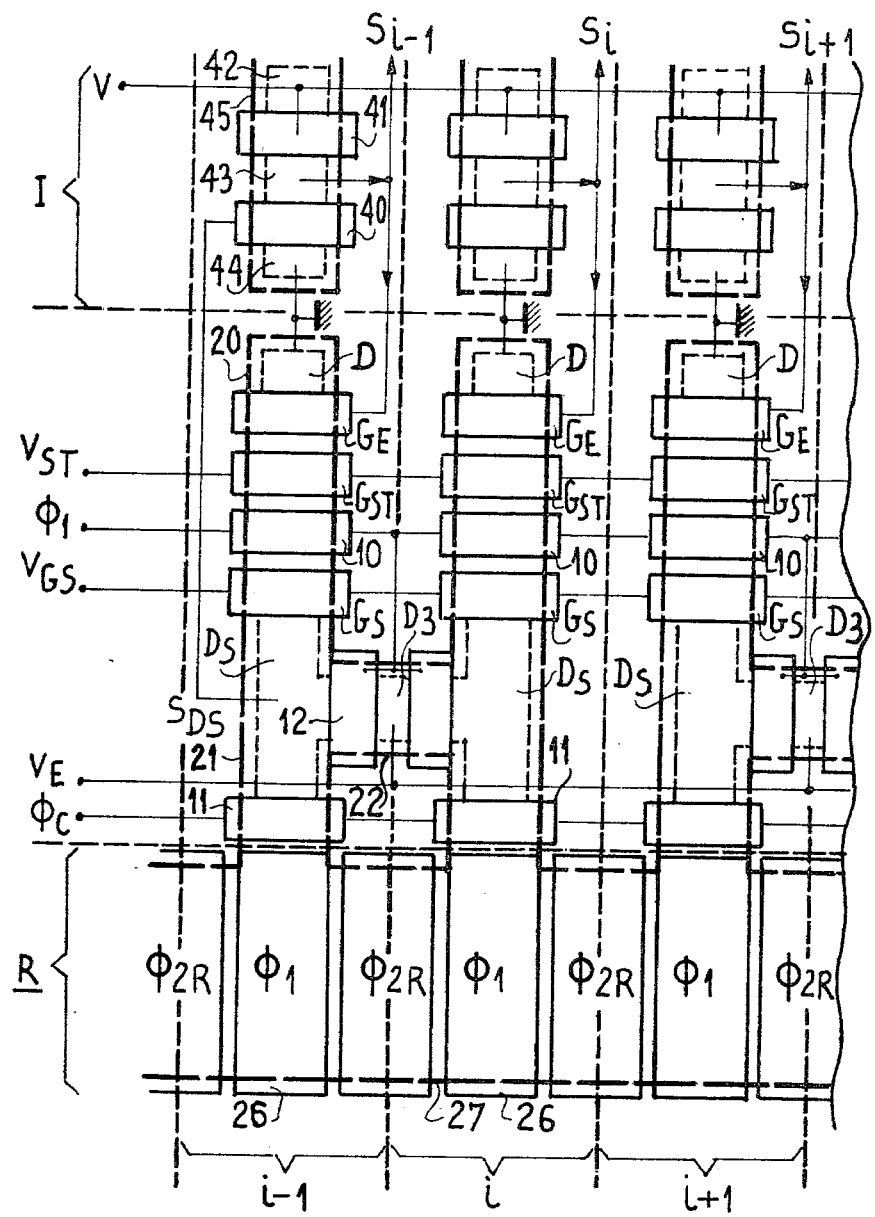
FIG_9

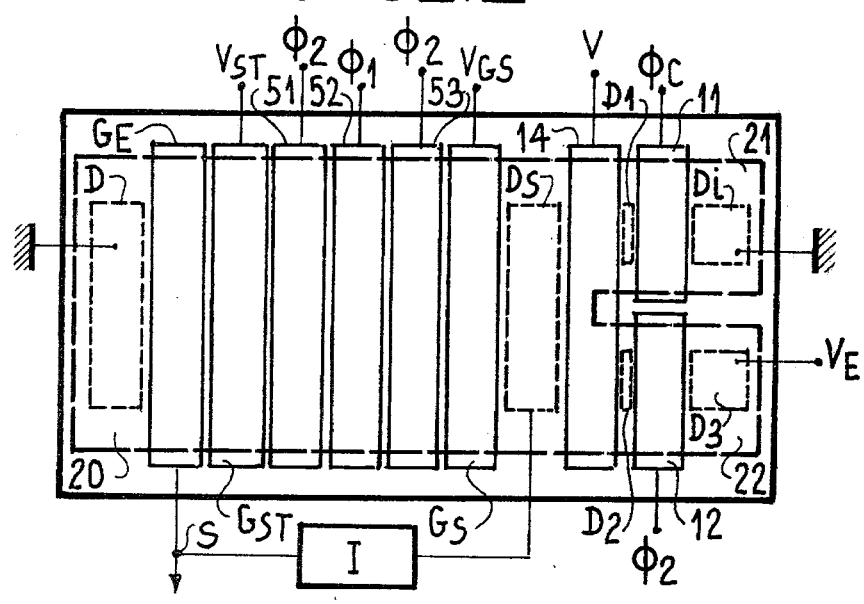

FIG_11
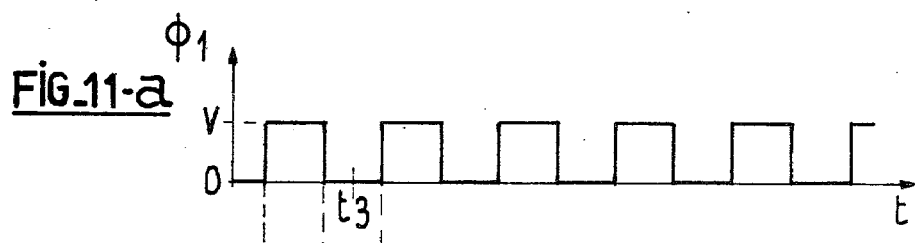
FIG_11-a
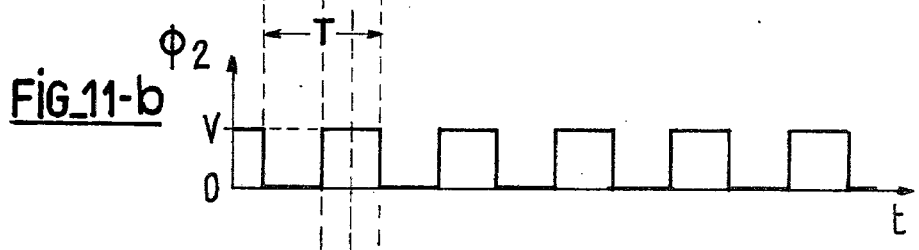
FIG_11-b
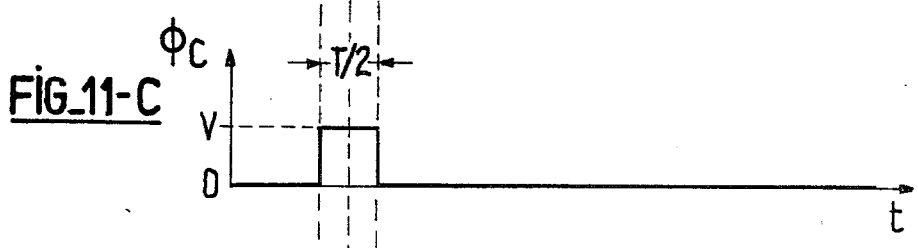
FIG_11-c
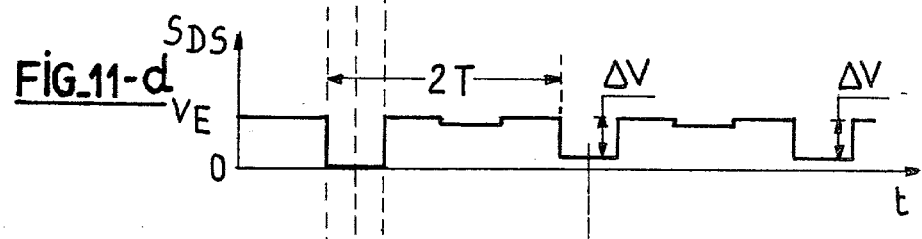
FIG_11-d
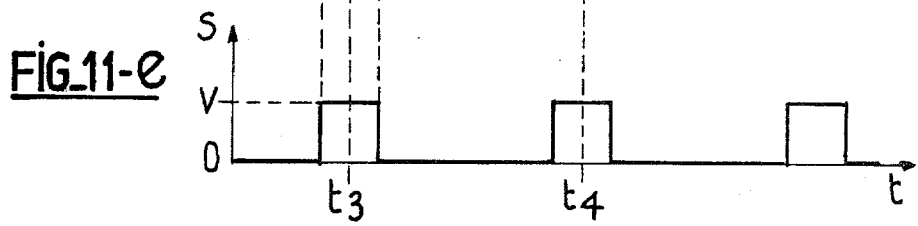
FIG_11-e

DYNAMIC MEMORY CELL OF THE CHARGE TRANSFER TYPE APPLICABLE IN PARTICULAR TO A SHIFT REGISTER

This invention relates to a dynamic memory cell involving the transfer of electric charges in a semiconducting medium. The invention is also concerned with the application of said memory cell, especially to a shift register, or to a frequency divider.

Different methods are known for fabricating memory cells and especially dynamic memory cells in which it proves necessary to carry out periodic regeneration of the stored signal. The aim of this invention is to provide a memory cell of simple design which is constructed from a charge-coupled device (CCD) and offers the same advantages as those attached to CCD's, namely simple construction and low power consumption.

The present invention is directed to a memory cell comprising, in one embodiment, means whereby packets of charges representing an electrical signal are injected into a semiconducting medium, electrodes disposed on the semiconducting medium and supplied with a periodic potential for transferring charges within the semiconductor to a so-called output diode with a predetermined time-delay. Said output diode also receives a sample of the signal to be stored and is connected to an element which delivers the output signal, said element being intended to produce both inversion and regeneration of the signal. The regenerated output signal is then applied to the injection means.

Further objects, distinctive features and results of the invention will become apparent from the following description and from the accompanying drawings, wherein:

FIG. 1 is a schamtic top view showing one embodiment of the memory cell according to the invention;

FIGS. 2a to 2e are waveform diagrams of signals which are applicable to the aforesaid memory cell or delivered by this latter;

FIGS. 3a to 3d are explanatory diagrams of operations of the device shown in FIG. 1;

FIGS. 4a and 4b show respectively a waveform diagram and the transfer characteristic of one of the elements constituting the device of FIG. 1;

FIG. 5 illustrates an alternative form of construction of the memory cell in accordance with the invention;

FIG. 6 illustrates the principle of application of the memory cell in accordance with the invention to the construction of a shift register;

FIG. 7 is a first form of embodiment of FIG. 6;

FIGS. 8a, 8b and 8c are waveform diagrams of signals which are applicable to the device of FIG. 7;

FIG. 9 is a second form of embodiment of FIG. 6;

FIG. 10 illustrates the application of the memory cell in accordance with the invention to frequency division;

FIGS. 11a to 11e are waveform diagrams of signals which can be applied to the device of FIG. 10 or delivered by this latter.

In these different figures, the same references designate the same elements.

The memory cell in accordance with the invention is illustrated schematically in the top view of FIG. 1.

In accordance with a practice usually adopted in charge-coupled devices, the memory cell is constituted by a semiconductor substrate 1 (of silicon, for example) coated with an insulating layer (of silicon oxide, for example) and by electrodes placed on the insulating layer. Five of these electrodes or gates arranged in parallel relation to each other and designated successively as $G_E$, $G_{ST}$, 10, $G_S$ and 14 are placed at right angles to the direction X—X of transfer of charges within the semiconductor and extend over the entire width of the device. Two half-electrodes 11 and 12 are placed next to the electrode 14. Diodes produced, for example, by diffusion of impurities so as to form n-type regions are formed in the semiconductor substrate 1 which is of the p-type, for example. The first diode (D) is placed before the gate $G_E$ and connected to the reference potential of the device (ground potential); the second diode ($D_S$) is placed between the electrodes $G_S$ and 14; the third diode ($D_1$) is placed between the electrodes 14 and 11; the fourth diode ($D_i$) is placed after the electrode 11; the fifth diode ($D_2$) is placed between the electrodes 14 and 12; and finally, the sixth diode ($D_3$) is placed after the electrode 12. There is formed in the substrate 1 by any known means an insulating barrier 2 which is intended to define a channel 20 for transferring charges between the diode D and the electrode 14, and two parallel half-channels 21 and 22. The two channels just mentioned result from the division of the channel 20 beneath the electrode 14 into two portions; the channel 21 corresponds to the diodes $D_1$, $D_i$ and to the electrode 11 while the channel 22 corresponds to the diodes $D_2$, $D_3$ and to the electrode 12. The device further comprises an inverting and regenerating element I which is connected between the diode $D_S$ and the gate $G_E$.

One embodiment of the element I is shown in FIG. 4a.

Said element is constituted by two MOS transistors $T_1$ and $T_2$ which are connected in series between the potential V and ground. It should be noted that the transistor $T_1$ is of the depletion type and that all the other transistors illustrated both in FIG. 4a and in the following figures are of the enhancement type unless otherwise stated. The gate of $T_1$ is connected to the potential V while the gate of $T_2$ receives a signal $S_{DS}$ derived from the diode $D_S$. A signal S is available at the common node A of these two transistors.

FIG. 2 shows diagrams (FIGS. 2a to 2e) of signal waveforms as a function of time, these signals being applicable to the device of FIG. 1 or delivered by this latter.

Diagram 2a represents a potential $\phi_1$ or so-called tranfer potential having a substantially square-topped waveform, a period T and an amplitude which varies between O and V.

Diagram 2b represents a potential $\phi_C$ or so-called sampling potential which is different from zero only when it is desired to store the input signal during a period T/2, when $\phi_1$ is at the bottom (zero) level with an amplitude which is preferably equal to V.

Diagram 2c represents one example of binary input signal E applied to the device.

Diagram 2d represents the signal $S_{DS}$ which is delivered by the diode $D_S$ and is fed to the inverter I.

Diagram 2e represents the signal S delivered by the inverter I and which, on the one hand, constitutes the output signal of the device and, on the other hand, is applied to the gate $G_E$.

Diagrams 3a to 3d illustrate the operation of the device of FIG. 1 by means of a cross-section taken along the axis X—X of FIG. 1.

There is therefore shown in FIG. 3 the semiconductor substrate 1 of p-type, for example, in which regions of opposite type (n) are diffused in order to form the diodes, D, $D_S$, $D_2$ and $D_3$. The substrate is uniformly covered with an insulating layer 2, the interface 1-2 being designated by the reference 120. On the insulating layer 2 is deposited a first series of electrodes, namely the electrodes $G_{ST}$, 10, $G_S$, 12 and 14. The insulating layer 2 and the electrodes of the first series are covered with a second insulating layer 3 on which is deposited a second series of electrodes, namely the electrode $G_E$ as well as two electrodes 100 and 101 (not shown in FIG. 1), said electrodes being placed respectively between on the one hand the electrodes $G_{ST}$ and 10 and on the other hand 10 and $G_S$ and being electrically connected respectively to the electrodes 10 and $G_S$. This arrangement of the electrodes in two series separated from the semiconductor substrate by different thicknesses of insulator is shown neither in FIG. 1 nor in FIGS. 5, 7, 9, 10 and 12 for the sake of enhanced clarity of the drawings. In accordance with well-known practice, this arrangement has the intended function on the one hand of permitting transfer of charges within the semiconductor only in one direction and on the other hand of preventing the formation of potential barriers between the adjacent electrodes. Since the electrodes are not on the same level in the arrangement under consideration, they can in fact overlap to a partial extent as illustrated in FIG. 3. Similarly, the diode $D_2$ between the electrodes 12 and 14 as well as the diode $D_1$ between the electrodes 11 and 14 have the design function of preventing the formation of a potential barrier between these two electrodes.

The operation of this device is as follows:

At the initial instant ta illustrated in FIG. 2 and in diagram a of FIG. 3, the potential $\phi_C$ is at the low level, thus isolating the diode $D_S$ from the input signal E and the potential $\phi_1$ is at the high level (V), with the result that a potential $V_E$ which is close in value to the potential V can be applied to the diode $D_S$ through the channel 22: in fact, the diode $D_3$ is connected to the potential $V_E$ (line 38) and the electrode 12 (dashed line 37 opposite to said electrode) is connected to the potential $\phi_1$. The inverter I therefore delivers a zero signal S. The diode D is also connected to ground, this potential level being represented in FIG. 3a by a line 30 opposite to the diode D and the electrode $G_{ST}$ is maintained at a constant positive potential $V_{ST}$ (dashed line 32 opposite to the electrode $G_{ST}$). It is apparent from FIG. 3a that the signal S applied to the gate $G_E$ (dashed line 31 opposite to said electrode $G_{ST}$) prevents injection of charges from the diode D to the remainder of the device.

At a subsequent instant tb illustrated in diagram b of FIG. 3 in which only the interface 120 and the potential levels within the substrate have been shown for the sake of simplicity, the potential $\phi_C$ is at the top level (instant tb shown in FIG. 2), thus having the effect of transmitting to the diode $D_S$ the value of the input signal E applied to the diode $D_i$ (see FIG. 1).

Said signal E can assume two values, namely zero and one, the first or "zero" value being represented by a continuous potential $V_E$ and the second or "one" value being represented by the reference potential (ground potential). The signal E is transmitted from the diode $D_i$ to the diode $D_S$ on condition that the constant potential applied to the electrode 14 is of sufficiently high value; this potential is preferably equal to the amplitude V. For example, if the input signal E is equal to "one" represented by a zero potential level (FIG. 2c) at the instant tb, the signal $S_{DS}$ is zero and the inverter I delivers a non-zero signal S which is equal to V and applied to the gate $G_E$. It is apparent from diagram 3b that the application of the signal S to the gate $G_E$ (the corresponding potential level being represented by a dashed line 33 opposite to the gate $G_E$) permits the injection of a charge packet beneath the gates $G_E$ and $G_{ST}$ and only beneath these latter because the potential $\phi_1$ is at the low level (dashed line 34 in FIG. 3b opposite to the electrodes just mentioned).

When the potential $\phi_1$ returns to the high level (dashed line 35) at an instant tc shown in diagram c of FIG. 3, the charges which were injected previously are then transferred under the electrode 10 and their progression then stops at the point if, as shown in FIG. 3c, the potential $V_{GS}$ (dashed line 36) to which the following electrodes (101 and $G_S$) are brought is substantially lower than the potential V. The potential $V_{GS}$ can in practice be equal to the potential $V_{ST}$. During this step tc, the potential $\phi_C$ has returned to the low level, thus isolating the diode $D_S$ from the input signal (channel 21) whereas said diode $D_S$ receives the potential $V_E$ through channel 22: in fact, the diode $D_3$ is connected to the constant potential $V_E$ and the electrode 12 which separates said diode from the diode $D_S$ is connected to the potential $\phi_1$ which is then at the high level (line 37). In consequence, the signal $S_{DS}$ delivered by the diode $D_S$ is at the high level (line 38) and therefore the signal S applied to the gate $G_E$ is at the low level (line 31); this has the effect of preventing any further injection of charges.

At a subsequent instant td, the potential $\phi_1$ reverts to the low level (line 39), the potential $\phi_C$ is still at the low level and the diode $D_S$ is therefore isolated. At the same time, the charge packet reaches the diode $D_S$ after having passed under the electrodes 101 and $G_S$, said electrodes being connected to the constant potential $V_{GS}$. The effect of this charge packet is to reduce the initial potential of the diode $D_S$ (line 38) by a quantity $\Delta V$ which is a function of the quantity of charges. it is this value $\Delta V$ which governs the choice of the value $V_E$: this value must in fact be such that the variation $\Delta V$ causes the inverter I to change state as shown in FIG. 4.

FIG. 4b represents the transfer characteristic of the inverter I of FIG. 4a. It is apparent from this curve that:

when the signal $S_{DS}$ applied to the inverter is at a level which is chosen so as to be higher than a threshold potential $V_B$, the signal S delivered by the inverter is at a low level which is in the vicinity of zero;

when the signal $S_{DS}$ is at a low level or in other words lower than a second threshold potential $V_C$, the output signal S is at a high level, substantially equal to V;

when $S_{DS}$ varies between $V_B$ and $V_C$, the output signal S varies substantially continuously between points B and C, from the low level to the high level.

The foregoing shows that it is therefore necessary to choose $V_E$ in such a manner as to ensure that the difference ($V_E-V$) is greater than $V_C$ in order to produce a change of state of the inverter I, or in other words to ensure that its output signal S changes from the low level to the high level. In practice, $V_E$ is chosen so as to be close to $V_B$ but of higher value.

In regard to the order of magnitude of the different potentials applied to the device, if the amplitude V of the potential $\phi_1$ is of the order of 12 volts, the constant potential applied to the electrode 14 is preferably equal to 12 volts whilst the constant potentials $V_{ST}$ and $V_{GS}$ have a lower value of the order of 5 volts, for example.

It is apparent that, when the input signal E is at the low level (zero volt), the device described in the foregoing makes it possible to obtain from the diode $D_S$ a signal $S_{DS}$ having a substantially square-topped waveform having the same period T as the potential $\phi_1$ which, after regeneration by the inverter I, delivers a square-wave output signal S whose amplitude and period are equal to those of $\phi_1$ and shifted with respect to this latter by T/2.

When the input signal E is at the high level ($V_E$) and when the potential $\phi_C$ changes to the high level (instant te in FIG. 2), a potential $V_E$ is transmitted to the diode $D_S$ through the channel 21; the signal $S_{DS}$ is then at the high level and therefore the signal S derived from the inverter is at the low level. At the following instant (tf in FIG. 2), the same potential $V_E$ is maintained on the diode $D_S$ but in that case through the channel 22, which modifies neither the signal $S_{DS}$ (high level) nor the signals S (low level). It is therefore observed that the output signal S is maintained at the bottom level (zero volt) as long as the input signal E is at the high level.

By virtue of the foregoing arrangements, the result thus achieved is a dynamic memory cell which makes it possible to store binary information (E at the high level or at the low level). This information is available at the output S with an inversion during a period corresponding to the time interval during which the potential $\phi_1$ is at the low level.

As can be noted from the foregoing description, it has been assumed that the semiconductor substrate was p-type while the transferred charges were minorty carriers (electrons); it is readily apparent that a n-type substrate in which a flow of holes takes place can also be employed provided that the polarity of all the applied potentials is revesed.

Different alternative forms of the device described in the foregoing can be contemplated including suppression of the electrode 14. In fact, this electrode does not play any active part in the charge transfer process. However, it may be found preferable to retain the electrode since it does perform a function of screen between the diodes $D_S$ and the electrode 12 to which the potential $\phi_1$ is applied. Accordingly it makes it possible to limit the amplitude of fluctuations of the signal $S_{DS}$ resulting from $\phi_1$ as illustrated in FIG. 2d after the instant tf, thus preventing a change of state of the inverter I.

Another alternative form of said device consists in carrying out the inversion function by modifying the signals applied to the injection stage shown in FIG. 5 instead of making use of an external inverter I of the type shown in FIG. 4a.

FIG. 5 is identical with FIG. 1 with the exception of the inverter I which is dispensed with since the diode $D_S$ is connected directly to the diode D, and of a signal $V_G$ which is applied to the gate $G_E$; this signal consists of a periodic potential which is at a high level preferably equal to V, during very short time intervals having a value below T/2 while the potential $\phi_1$ itself is at the low level.

During operation as was the case earlier, when the input signal E is at the high level, the signal $S_{DS}$ remains at the high level either through the channel 21 or through the channel 22. It is further observed, however, that when these signals are applied and when $S_{DS}$ and D are at the high level, injection of charges is not possible, with the result that the signal $S_{DS}$ therefore remains at the high level since no charge packet will reduce the potential of the diode $D_S$ as at the instant td described earlier.

On the contrary, when the input signal E is at the low level as in the previous instance, the signal $S_{DS}$ returns to the low level when $\phi_C$ is at the high level (instant tb). In the device shown in FIG. 5, injection of charges is then possible and results in a time-dependent variation of the squarewave signal $S_{DS}$ which is similar to that described in the case of the device shown in FIG. 1.

The memory cell of FIG. 5 thus makes it possible to retain binary information which is available at the output $S_{DS}$ without inversion for the duration of the low-level period of the potential $\phi_1$.

FIG. 6 illustrates the principle of application of the memory cell in accordance with the invention to the construction of a shift register which is capable of continuously delivering digital information at one output of the parallel type.

It is in fact known that a shift register involving the use of the charge transfer technique is capable of distributing information of the series type on parallel outputs but is not capable of retaining this information. In point of fact, thermal agitation within the semiconductor causes degradation of the potential wells and results in loss of the information after a certain period of time.

In order to remedy this defect, a memory cell in accordance with the invention is placed at the output of each parallel output of the charge transfer register as shown in FIG. 6.

In this figure, an input signal e which is a series binary information signal is applied to the input of a shift register R having n stages represented schematically by n adjacent cells $R_1 \ldots R_i \ldots R_n$. The output $E_i$ of each cell $R_i$ is connected to a memory element $M_i$ as described in the foregoing. Each element $M_i$ continuously delivers the binary information at one output $S_i$. The n outputs $S_i$ considered together constitute the permanent parallel output of the device.

FIG. 7 illustrates a first practical embodiment of the diagram of FIG. 6.

In the figure, there is shown a charge-transfer shift register R constituted in the conventional manner by a semiconductor substrate coated with insulating material on which are deposited identical and parallel electrodes to which are applied given periodic potentials such as, for example, $\phi_1$ in the case of the even-numbered electrodes (26) and $\phi_{2R}$ in the case of the odd-numbered electrodes (27). In order to simplify the diagram, the register R is represented only by its electrodes within which the applied potential is noted. In accordance with a conventional process, the electric charges are transferred from one electrode to the next in a direction Z—Z normal to the electrodes 26 and 27 within a channel limited by an insulating barrier 23.

The insulating barrier 23 is interrupted at each stage or in other words, for example, at the level of each electrode 26 for the connection of a memory cell in accordance with the invention. The connection is established through the channel 21 which is located in the line of extension of the channel 20, the channel 22 being located at right angles to these latter.

In this figure as in the following figures, the memory cell shown by way of example is the same as the cell described with reference to FIG. 1 but can clearly be replaced by any one of its alternative embodiments. Furthermore, the cell is represented in this case only by a single stage for the sake of simplicity.

The memory cell is therefore identical with the cell illustrated in FIG. 1 except for three differences:

the diode $D_i$ of channel 21 which served to inject the input signal E is dispensed with since the input signal is now constituted by a charge packet under the electrode 26;

orientation of the channel 22 which becomes normal to the axis X—X owing to general considerations of bulk, thus entailing a slight change in the shape of the diode $D_S$ which is now in the shape of a T in order to ensure that the three channels 20, 21 and 22 are still connected to each other;

the electrode 14 which is connected to the potential V and now extends only along the channel 22; this electrode is really necessary only in the channel just mentioned by reason of the fact that, as stated earlier, its design function is to constitute a screen between the diode $D_S$ and the potential $\phi_1$ which is applied to the electrode 12 of said channel 22.

The operation of this device will be explained with reference to FIG. 8 which represents the signals $\phi_1$, $\phi_{2R}$ and $\phi_C$ applied thereto.

The signal $\phi_1$ represented in diagram 8a is identical with that of diagram 2a.

The signal $\phi_{2R}$ which is applied to the electrodes 27 of the register R is identical with the signal $\phi_1$ but in opposite phase with respect to this latter, up to an instant $t_1$.

Prior to the instant $t_1$, the digital data are injected in series into the register R and the signals $\phi_1$ and $\phi_{2R}$ effect the transfer of said data until these latter occupy the entire register (at the instant $t_1$).

After the instant $t_1$ which takes place when the potential $\phi_{2R}$ is normally intended to return to the high level (V), this latter remains at the low level throughout a period (T). At this instant $t_1$, the signal $\phi_C$ illustrated in diagram 8c changes to the high level for a time-duration in the vicinity of T/2.

At a following instant $t_2$, the potentials $\phi_1$ and $\phi_{2R}$ are at the low level whereas $\phi_C$ is at the high level. Two cases are then possible:

if charges are present under the electrode 26 of the register R and represent, for example, binary information equal to 1, said charges are all transferred to the diode $D_S$ under the action of $\phi_C$ and of $\phi_{2R}$, thus bringing the potential of $D_S$ back to zero volt and consequently causing the injection of a charge packet into the memory cell by means of the inverter I. The information is thus stored and available at the output S in the form illustrated in diagram 2e;

if no charge packet is present under the electrode 26 of the register R and this abasence represents, for example, binary information equal to zero, the diode $D_S$ remains at the level $V_E$; the signal S delivered by the inverter I is then zero and there is no injection of charge packet into the memory cell. The low level is then maintained by the memory cell and available at the output S.

FIG. 9 shows another practical embodiment of the diagram of FIG. 6 which is particularly compact.

In this figure as in FIG. 7, the shift register R has been represented by its electrodes 26 and 27 which are brought respectively to the potentials $\phi_1$ and $\phi_{2R}$. Each electrode 26 which is brought to the potential $\phi_1$ defines one stage of the register R; three of these stages are shown in the figure and designated respectively as $i-1$, i, and $i+1$. A memory cell in accordance with the invention is connected to each electrode 26 in much the same manner as described in FIG. 7, that is to say through the channel 21 which begins with the electrode 11 connected to the potential $\phi_C$. As in FIG. 7, the channel 20 is located in the line of extension of the channel 21 and the channel 22 is parallel to the register R. However, this embodiment differs from the preceding embodiment in regard to two points:

the channel 22 which deos not have an electrode 14 and in which the diode $D_3$ is common to two adjacent stages (channels $i-1$ and i in FIG. 9);

the inverter I which is formed on the same substrate as the register R and the memory cells in the line of extension of the channel 20.

The inverter I comprises three zones 42, 43 and 44 of opposite conductivity type relative to those of the substrate. Two electrodes 41 and 40 respectively which constitute the gates of the transistors $T_1$ and $T_2$ of FIG. 4a are placed between said zones. The zone 44 is connected to ground, the zone 43 is the common node A of the two transistors, namely the output of the inverter, and the zone 42 is brought to the potential V. These elements are isolated from the other elements in the substrate by an insulating barrier 45 similar to barrier 2 in FIG. 1.

In this embodiment, practically the entire memory cell is therefore placed in the line of extension of the electrode 26 of the register R to which it is applied except for the channel 22 which is reduced to a minimum size by suppression of the electrode 14 and common connection of the diode $D_3$. This arrangement permits the application of the memory cell in accordance with the invention to a shift register having a small pitch, that is, the distance between the centers of two consecutive electrodes 26. By way of example, said pitch can be of the order of 40 μm.

FIG. 10 shows one mode of application of the memory cell in accordance with the invention to frequency division.

The device of FIG. 10 may, for example, be identical with the device of FIG. 1 except for the electrodes 10 and 12 and the diode $D_i$. The electrode of FIG. 1 is in fact replaced by three parallel electrodes 51, 52 and 53 which receive the potential $\phi_1$ in the case of the electrode 52 while the other two electrodes 51 and 53 on each side of this latter receive a potential $\phi_2$. In FIG. 10, the electrode 12 is brought to the same potential $\phi_2$. The potential $\phi_2$ is preferably identical with the potential $\phi_1$ but phase-shifted by T/2 with respect to this latter. The diode $D_i$ is permanently connected to ground.

FIGS. 11a, b, c, d, e represents signals which can be applied to or delivered by the device of FIG. 10.

Diagram a reproduces the shape of the potential $\phi_1$ of FIG. 2a.

Diagram b represents the potential $\phi_2$ as stated in the foregoing.

Diagram c reproduces the shape of the potential $\phi_C$ of FIG. 2b.

Diagrams d and e illustrate the signals $S_{DS}$ and S which are delivered respectively by the diode $D_S$ and the inverter I.

The operation of the device of FIG. 10 is as follows:

As in the device of FIG. 1, injection of charges takes place when the potential $\phi_C$ is at the high level; at this instant ($t_3$ in FIG. 11), a zero potential is applied to the diode $D_S$ via the channel 21 while the channel 22 is closed by the potential $\phi_2$ at the low level; since the signal $S_{DS}$ is zero, the signal S delivered by the inverter I is at the high level, is applied to the gate $G_E$, and permits injection of charges into the device. This charge packet must then flow under the electrodes 51, 52 and 53 and will reach the diode $D_S$ only after a time interval equal to 2T by reason of the potentials applied to the electrodes aforesaid; at this instant ($t_4$ in FIG. 11), said charge packet produces a reduction ($\Delta V$) of the potential of the diode $D_S$ and subsequently initiates transition of the signal S to the high level during a time interval T/2.

It is therefore apparent that the signal S has a frequency equal to $\frac{1}{3}T$ when an additional pair of electrodes is placed on the channel 20, said electrodes being connected respectively to the potentials $\phi_1$ and $\phi_2$.

In more general terms, the signal S has a frequency divided by (N+1) when 20 N additional pairs of electrodes are placed on the channel 20 and connected to the potential $\phi_1$ and $\phi_2$.

In an alternative form (not illustrated) of said device, there can be obtained a signal which is delayed by one half-period T/2.
with respect to the signal S by modifying the potentials applied to the electrodes 51, 52 and 53. Thus the potential $\phi_2$ must be applied to the electrode 52 while the potential $\phi_1$ is applied to the other two electrodes.

What is claimed is:

1. A dynamic memory cell of the charge transfered type for storing a binary signal, comprising a semiconductor substrate in which electric charges can be transferred in channels designed in said substrate, means for injecting charge packets representing an electrical signal into the semiconductor substrate, an output diode to which is applied a sample of said binary signal, electrodes, periodic transfer potentials applied thereto being such that the charge packets propagate within a first of said channels and reach the output diode with a well-defined timelag with respect to their instant of injection, said memory cell further comprising means for inversion and regeneration of the signal delivered by the output diode and for delivering an output signal which is applied to the injection means.

2. A memory cell according to claim 1, wherein said cell further comprises a diode which defines a second of said channels and to which the signal to be stored is applied, and an electrode to which a sampling potentials is applied for sampling and application of the signal to be stored to the outut diode.

3. A memory celle according to claim 2, wherein said cell further comprises a third charge propagation channel comprising a diode to which is applied a constant potential and an electrode to which is applied a periodic transfer potential such that said constant potential is applied to the output diode when said binary signal is not applied thereto.

4. A memory cell according to claim 2, wherein said cell further comprises an electrode which is adjacent to the output diode and extends at least along the second channel, said electrode being brought to a constant potential which is equal to or higher than the maximum amplitude of the signal delivered by said output diode.

5. A memory cell according to claim 1, wherein the injection, inversion and regeneration means comprise a diode and two electrodes, the diode being adapted to receive the output signal of the output diode, the second electrode being maintained at a constant potential whose amplitude is comprised between the minimum and maximum values of the amplitude of said output signal of the output diode, the first electrode being adapted to receive a periodic potential which permits only periodic injection of charge packets representing said output signal of the output diode.

6. A memory cell according to claim 1, wherein said inversion and regeneration means comprise two MOS transistors connected in series between ground and a constant potential, the common node being intended to deliver the output signal, the gate of the transistor which is connected to ground being adapted to receive the output signal of the output diode, and the gate of the second transistor being connected to the constant potential.

7. A memory cell according to claim 1, wherein said injection means comprise a diode and two electrodes, the diode being maintained at a first constant potential, the first electrode being adapted to receive the output signal and the second electrode being brought to a second constant potential of higher value than the first.

8. A memory cell according to claim 1, wherein the first channel comprises an electrode placed after the injection means and connected to a transfer potential.

9. A charge-transfer shift register comprising an input for receiving a signal of the series type, and a plurality of stages, wherein said shift register comprises in addition a plurality of memory cells according to claim 1, the output of each stage of the shift register being connected to the input of one of the memory cells, all the outputs of the aforementioned cells being such as to constitute one parallel-type output of said shift register.

10. A shift register according to claim 9, wherein the first and second channels are placed at right angles to the direction of charge transfer with the stages of the shift register and wherein the third channel is placed parallel to said direction.

11. A shift register according to claim 9, wherein adjacent memory cells considered in pairs have a common diode constituted by the diode of the third channel.

12. A frequency divider for delivering a signal having a frequency which is divided by (N+1) with respect to a signal having a given period, comprising a memory cell according to claim 1, wherein the first channel is provided after the injection means with N pairs of electrodes, the electrodes of each pair being connected respectively to said signal having a given period and to a signal having the same period but phase-shifted with respect to the preceding signal by one half period.

* * * * *